United States Patent
Tsai et al.

(10) Patent No.: US 8,816,486 B2
(45) Date of Patent: Aug. 26, 2014

(54) PAD STRUCTURE FOR 3D INTEGRATED CIRCUIT

(75) Inventors: Chih-Sheng Tsai, Houli Shiang (TW); Chung-Hsing Wang, Baoshan Township, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 189 days.

(21) Appl. No.: 12/119,255

(22) Filed: May 12, 2008

(65) Prior Publication Data

US 2009/0278251 A1 Nov. 12, 2009

(51) Int. Cl.
*H01L 23/02* (2006.01)
*H01L 23/48* (2006.01)

(52) U.S. Cl.
USPC ........... 257/686; 257/777; 257/758; 257/783; 257/786; 257/E23.145; 257/774

(58) Field of Classification Search
USPC ......... 257/686, 786, 758, 773–778, E21, 502, 257/620, 621, 276, 723, E23.076, 782, 257/E23.145; 438/107–109, 667
See application file for complete search history.

(56) References Cited

U.S. PATENT DOCUMENTS

| | | | | |
|---|---|---|---|---|
| 4,939,568 A * | 7/1990 | Kato et al. | | 257/686 |
| 7,221,034 B2 * | 5/2007 | Ma et al. | | 257/502 |
| 7,224,052 B2 * | 5/2007 | Nishizawa et al. | | 257/679 |
| 7,416,971 B2 * | 8/2008 | Lin et al. | | 438/618 |
| 7,589,409 B2 * | 9/2009 | Gibson et al. | | 257/686 |
| 7,692,278 B2 * | 4/2010 | Periaman et al. | | 257/686 |
| 8,008,764 B2 * | 8/2011 | Joseph et al. | | 257/686 |
| 2006/0063371 A1 * | 3/2006 | Lin et al. | | 438/618 |
| 2007/0290300 A1 * | 12/2007 | Kawakami | | 257/621 |
| 2008/0073747 A1 * | 3/2008 | Chao et al. | | 257/520 |

FOREIGN PATENT DOCUMENTS

WO WO 2005/101475 10/2005

OTHER PUBLICATIONS

CN Office Action Appln. No. 200910002060.6.

* cited by examiner

*Primary Examiner* — Nitin Parekh
(74) *Attorney, Agent, or Firm* — K&L Gates LLP

(57) ABSTRACT

An I/O pad structure in an integrated circuit (IC) comprises a first vertical region in the IC including a top metal layer and one or more semiconductor devices formed thereunder, the top metal layer in the first vertical region serving as a first pad, the semiconductor devices being electrically connected to the first pad, and a second vertical region in the IC next to the first vertical region including the top metal layer and one or more through-silicon-vias (TSVs) formed thereunder, the top metal layer in the second vertical region serving as a second pad, and no semiconductor devices being formed beneath the second pad, the TSVs being electrically connected to the second pad, wherein the first and the second pad are electrically connected through at least one metal layer.

14 Claims, 3 Drawing Sheets

US 8,816,486 B2

PAD STRUCTURE FOR 3D INTEGRATED CIRCUIT

BACKGROUND

The present invention relates generally to semiconductor devices, and, more particularly, to input/output (I/O) pad structure for 3D integrated circuit (IC).

A semiconductor IC chip communicates with the outside world through various I/O pads, such as signal pads, and power/ground (P/G) pads. FIG. 1 is a cross-sectional view of a conventional I/O pad structure 100, which is formed in an exemplary 7-metal, circuit-under-pad (CUP) process. An I/O cell structure 120 including metal 1 through metal 5 as interconnect is formed on top of a substrate 110. The I/O cell structure 120 can be any circuit as only two top metal layers, metal 6 (134) and metal 7 (136) are used in this case for the pad structure 130. Metal 7 (136) is connected to metal 6 (134) by vias 144. Metal 6 (134) are connected to the I/O cell 120 by vias 142. A bonding wire is then attached to the metal 7 (136). The I/O cell structure 120, for inputting and/or outputting signals and for receiving power and ground supplies, typically includes semiconductor devices such as transistors and resistors. Such semiconductor devices may be used in input buffers, output drivers or electrostatic discharge (ESD) circuits. In general, the semiconductor devices are considered to involve active area, as electrical conductivity in these area, unlike in metals, is semi-conductive, i.e., in between that of a conductor and that of an insulator.

However, the I/O pad structure 100 is developed for single chip packaging technology. As three-dimensional (3D) integrated circuit (IC) is gaining popularity, I/O pad structures should be able to fit the new 3D IC technology.

FIG. 2 is a cross-sectional view of an exemplary 3D IC pad structure 200. Two dies 210 and 230 are stacked face-to-face in order to save space. The bottom die 210 comprises a substrate 212 and an inter-connector 218 connecting the substrate 212 to a Cu-bond 221 through a dielectric material 215. Semiconductor devices, such as transistors, are formed in the substrate 212. The inter-connector 218 may include multiple metal layers, vias and contacts (not shown). A via connects two metal layers. A contact connects a metal layer to the substrate 212. The Cu-bond 221 is a metal surface for making connection with a Cu-bond 241 on the top die 230. The top die has a similar structure including a substrate 232, an inter-connector 238 connecting the substrate 232 to the Cu-bond 241. The inter-connector 238 may include multiple metal layers, vias and contacts (not shown). Outside signals and power supplies are connected to the top die 230. In a typical process, a through-silicon-via (TSV) 252 is used to connect the inter-connector 238 to a back-side metal (MB) 255. Then an Aluminum pad (AP) 260, typically in a form of redistributed-layer (RDL) is deposited on top of the MB 255. A bonding wire can be attached to the AP 260 at a bump 265.

Referring to both FIGS. 1 and 2, a skilled artisan would recognize that the conventional I/O cell pad 100 can not be used for 3D IC pad structure 200, as the TSV 252 and the inter-connector 238 prevents any I/O cell structure to be placed underneath the AP 260. A chip with I/O pad structure designed in a conventional way, as shown in FIG. 1, can not simply be flipped over and used for 3D ICs. As I/O cell structure is very critical and may require proven-in-silicon, redesigning an I/O cell structure for fit for 3D ICs is often time not practical and economical.

As such, what is desired is a structure that can adopt the conventional I/O pad structure to be used in 3D ICs without redesigning the conventional I/O pad structure.

SUMMARY

This invention discloses an I/O pad structure in an integrated circuit (IC) which comprises a first vertical region in the IC including a top metal layer and one or more semiconductor devices formed thereunder, the top metal layer in the first vertical region serving as a first pad, the semiconductor devices being electrically connected to the first pad, and a second vertical region in the IC next to the first vertical region including the top metal layer and one or more through-silicon-vias (TSVs) formed thereunder, the top metal layer in the second vertical region serving as a second pad, and no semiconductor devices being formed beneath the second pad, the TSVs being electrically connected to the second pad, wherein the first and the second pad are electrically connected through at least one metal layer.

According to one embodiment of the present invention, the aforementioned first pad is a probe pad while the second pad is a Cu-bond pad. According to another embodiment of the present invention, the aforementioned first pad is a Cu-bond pad while the second pad is a probe pad.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein.

DESCRIPTION

The present invention discloses a through-silicon-via (TSV) tail structure attached to a conventional I/O pad structure so that the same can be used in a 3-dimensional (3D) integrated circuit (IC).

Figure 1:
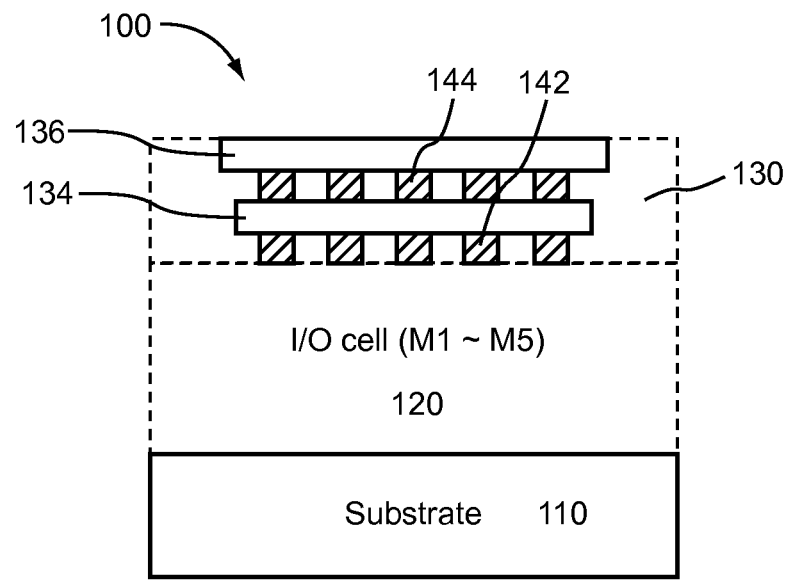
FIG. 1 is a cross-sectional view of a conventional I/O pad structure.
Figure 2:
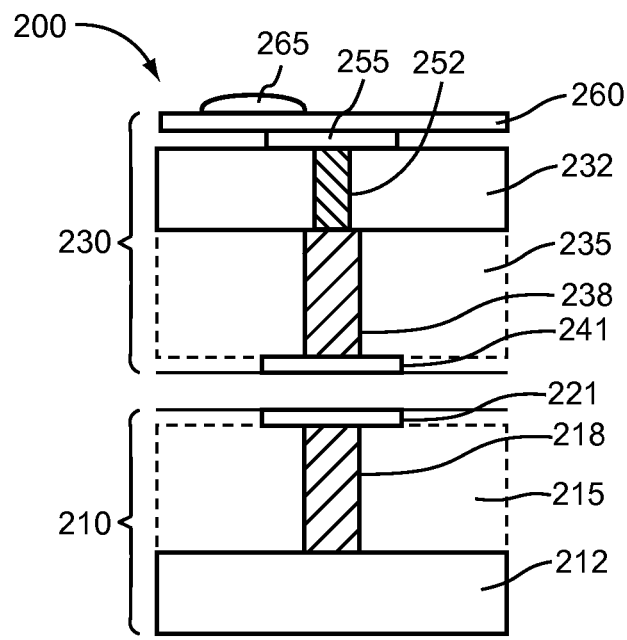
FIG. 2 is a cross-sectional view of an exemplary 3D IC pad structure.
Figure 3A:
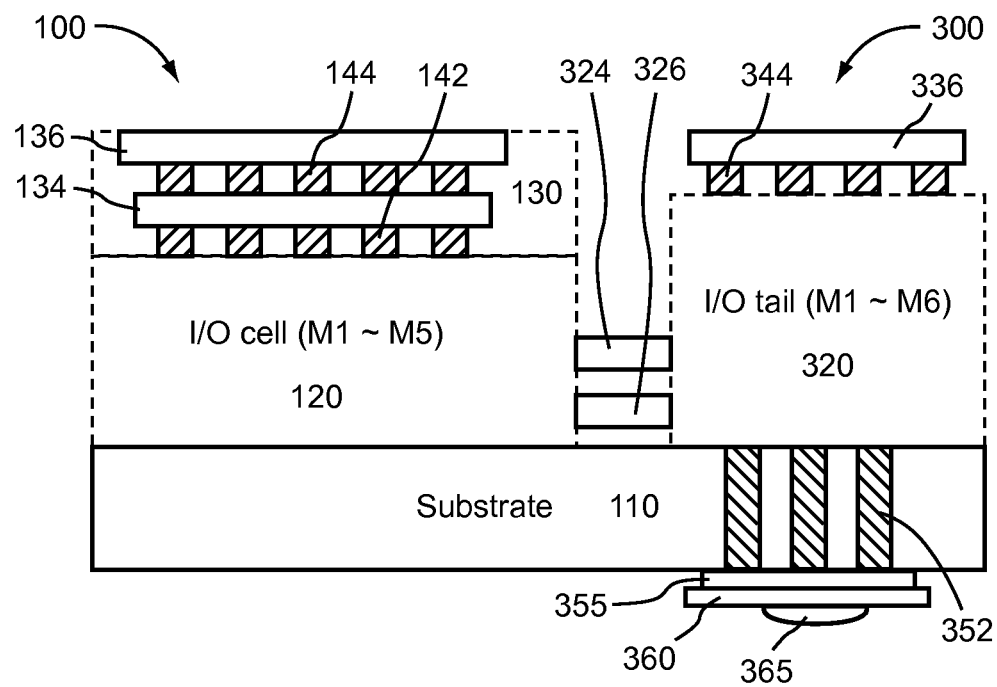
FIGS. 3A and 3B illustrate a TSV tail structure attached to a conventional I/O pad structure according to one embodiment of the present invention.
Figure 3B:
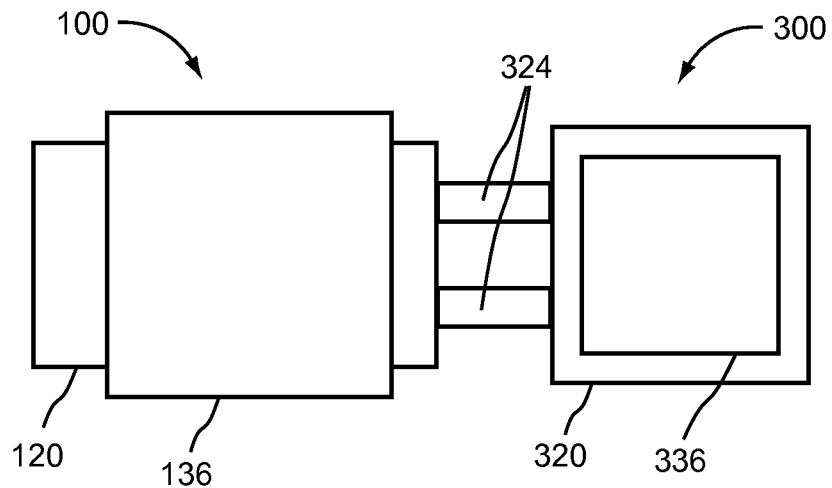

FIGS. 3A and 3B illustrate a TSV tail structure 300 attached to a conventional I/O pad structure 100 according to one embodiment of the present invention. The conventional I/O pad structure 100 is identical to the one shown in FIG. 1, where top two metal layers 134 and 136 is used for the pad to achieve better adhesion for the pad. Other metal layers underneath the top two metal layers 134 and 136 can form any structure. An I/O cell 120, including a functional circuit such as an electrostatic discharge (ESD) circuit, is typically placed underneath the pad metal layer 134 and 136 to save layout space. In order to allow the conventional I/O pad structure 100 to be used in a 3D IC, a TSV tail structure 300 is a placed next to the conventional I/O pad structure 100. The TSV tail structure 300 includes a top metal layer 336 for serving either as Cu-bond pad or probe pad. A Cu-bond pad is used for making a connection to another Cu-bond pad on a stacked die. A probe pad, on the other hand, is only used for a probe to make a contact thereto during a test. After the test, the probe pad is not being used.

Referring again to FIG. 3A, the TSV tail structure 300 also include an I/O tail connector 320 which, unlike the I/O cell 120, serves purely as a connection between the top metal layer 336 and the substrate 110. Apparently, that connection includes vias 344 between the top metal layer 336 and a subsequent metal layer beneath the top metal layer. The I/O tail connector 320 may include all the metal layers beneath the top metal layer 336. Different metal layers are connected by vias. As an example, the structures 100 and 300 shown in FIG. 3A is formed in a seven metal process, i.e., the top metal layer 336 is metal 7, and the I/O tail connector 320 is formed by metal 1 through metal 6 with respective vias. The I/O tail connector 320 is connected to the I/O pad structure 100 by two metal layers 324 and 326, which can be any two layers from metal 1 through metal 6. In fact, the connection can be made by a single metal layer or even all the metal layers as long as the I/O pad structure 100 is connected with the I/O tail structure 300.

Referring again to FIG. 3A, there is a plurality of TSVs 352 connects the I/O tail structure 320 with a back metal layer 355, which is covered by an Aluminum pad (AP) 360. A wire bonding bump 365 is attached to the AP 360.

FIG. 3B is a simplified top view of the I/O tail structure 300 being attached to the conventional I/O pad structure 100. The I/O pad structure 100 includes, typically, the probe pad 136, underneath which the I/O cell structure 120 is formed. The I/O tail structured 300 includes, typically, the Cu-bond pad 336, underneath which the I/O tail connector 320 is formed. The I/O cell structure 120 is connected to the I/O tail connector 320 by the metal layer 324. There may be another metal layer 326 (not shown) underneath the metal layer 324. The I/O pad structure 100 and the I/O tail structure 300 can be either butted or separated. Either case, they are electrically connected. The use of the I/O tail structure 300 is to allow a TSV structure being added, so that the chip can be used for 3D IC, without changing the conventional I/O pad structure 100. Redesign the I/O pad structure 100 may require many rounds of process iterations and therefore are costly with outcomes uncertain.

Figure 4A:
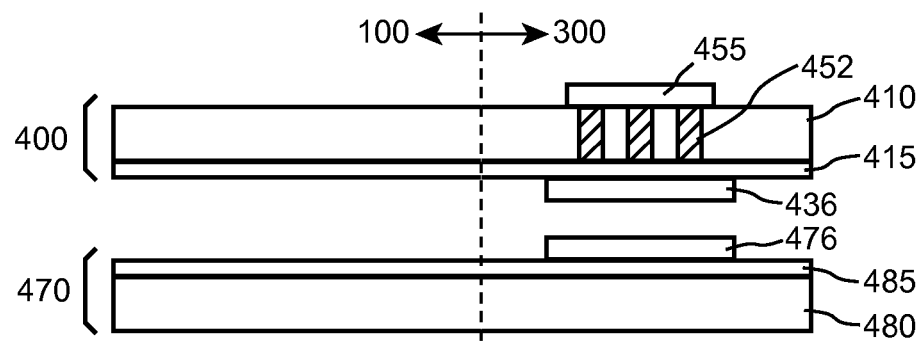
FIGS. 4A~4C illustrate various applications of the TSV tail structure in 3D ICs.
Figure 4B:
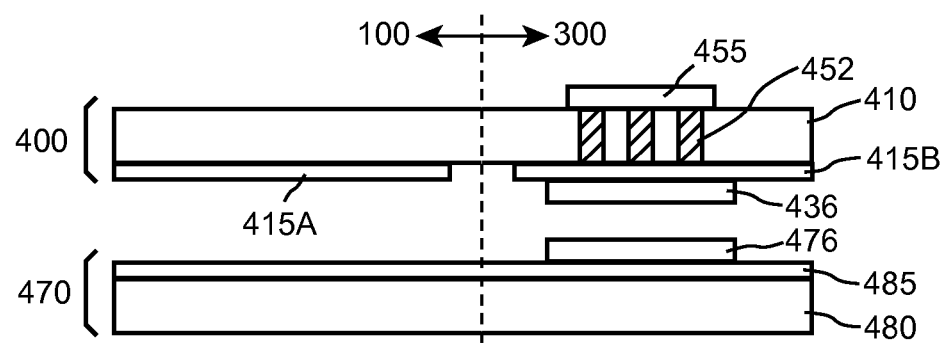
Figure 4C:
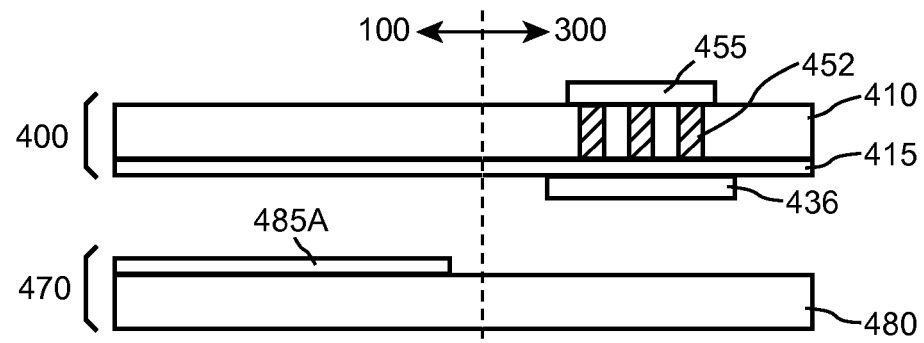

FIGS. 4A~4C illustrate various applications of the TSV tail structure in 3D ICs. Throughout the FIGS. 4A~4C, numeral 100 denotes the conventional I/O pad structure; numeral 300 denotes the I/O tail structure; numeral 400 denotes a top die; and numeral 470 denotes a bottom die; numerals 436 and 476 denote Cu-bond on the top die 400 and bottom die 470, respectively; numeral 452 denotes TSV in the top die 400; numeral 455 denotes back-side metal on the top die 400; and numerals 415 and 485, as well as their derivatives such as 415A or 485A, denote the connection between the I/O pad structure 100 and I/O tail structure 300 on the top die 400 and bottom die 470, respectively. Eventually the top die 400 and the bottom die 470 are bonded together in a face-to-face bonding technology, typically through heat and pressure.

FIG. 4A illustrates an application where an external signal, including power or ground supply, is shared by both the top die 400 and bottom die 470. Therefore, both the connection layer 415 of top die 400 and the connection layer 485 of the bottom die 470 are continuous from the I/O pad structure 100 to the I/O tail structure 300. The external signal is first connected to the back-side metal 455 on the top die 400 and then to the bottom die 470 through the Cu-bonds 436 and 476.

FIG. 4B illustrates an application where an external signal, including power or ground supply, is supplied only to the bottom die 470. Therefore, the connection layer 415 of top die 400 is broken between the I/O pad structure 100 to the I/O tail structure 300. But the connection layer 485 of the bottom die 470 is continuous between the I/O pad structure 100 to the I/O tail structure 300. The external signal is first supplied only to the I/O tail structure 300 of the top die 400, and then passed to the bottom die 470 through the Cu-bonds 436 and 476.

FIG. 4C illustrates an application where an external signal, including power or ground supply, is supplied only to the top die 400. Therefore, the connection layer 415 of top die 400 is continuous between the I/O pad structure 100 to the I/O tail structure 300. But the connection layer 485 of the bottom die 470 is not even present in the I/O tail structure 300 of the bottom die 470. The external signal is supplied only to the top die 400.

Although FIGS. 4A~4C illustrates the present invention being applied in face-to-face bonded 3D ICs, since the present invention solely concerns a dedicated region just for making a connection between the back and face of a die, a skilled artisan would appreciate that the present invention may be equally well applied in a face-to-back 3D IC bonding technology.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An I/O pad structure in a three-dimensional stacked integrated circuit (IC) with a top die and a bottom die bonded together, the I/O pad structure of each die comprising:
  a first vertical region including a first top metal layer and one or more semiconductor devices formed on a semiconductor substrate, the first top metal layer in the first vertical region serving as a first pad, the semiconductor devices being electrically connected to the first pad;
  a second vertical region disposed next to the first vertical region including a second top metal layer and brie or more through-silicon-vias (TSVs) formed'in said semiconductor substrate, the top die and the bottom die, the second top metal layer in the second vertical region serving as a second pad, wherein the top and bottom dies are bonded together in a face-to-face manner by bonding the second pad of each die together to form the three-dimensional stacked IC;
  a first metal connection layer electrically coupled to both the TSVs and the second pad of the top die;
  a second metal connection layer electrically coupled to both the TSVs and the second pad of the bottom die,
  wherein the first and the second metal connection layers are continuously disposed from the second vertical region to the first vertical region;

a back-side metal layer in an electrical contact with the TSVs in the second vertical region, wherein external signals are provided to the semiconductor devices of the first vertical region through the back-side metal layer and the TSVs of the top die;

a third pad formed in direct contact with the back-side metal layer for attaching a bonding wire thereto, wherein the external signals are provided to the third pad via the bonding wire;

at least one inter-connector connecting the TSVs to the second pad for providing external signals to the second pad; and wherein the first and second metal connection layers extend continuously from the second vertical region to the first vertical region to provide the external signals to each die, and wherein the TSYs are electrically connected to the second pad and no TSV is formed in the first vertical region, thereby the I/O pad structure being used for packaging more than a single IC chip without redesigning a structure of the first vertical region.

2. The I/O pad structure of claim 1, wherein the first pad is a probe pad and the second pad is a bond pad for making an electrical connection between the top die and the bottom die.

3. The I/O pad structure of claim 1, wherein the first pad is a bond pad for making an electrical connection between the top die and the bottom die and the second pad is a probe pad.

4. The I/O pad structure of claim 3, wherein the bond pad is made of Cu material.

5. The I/O pad structure of claim 1, wherein the semiconductor devices include transistors used in a circuit selected from a group consisting of output driver, input buffer, and electrostatic discharge (ESD) circuit.

6. The I/O pad structure of claim 1, wherein the third pad is made of aluminum material.

7. An I/O pad structure in a three-dimensional stacked integrated circuit (IC) with a top die and a bottom die bonded together, the I/O pad structure of each die comprising:

a first vertical region including a first top metal layer and one or more semiconductor devices formed on a semiconductor substrate, the first top metal layer in the first vertical region serving as a probe pad, the semiconductor devices being electrically connected to the probe pad;

a second vertical region disposed next to the first vertical region including a second top metal layer and one or more through-silicon-vias (TSVs) formed in said semiconductor substrate, the top die and the bottom die, the second top metal layer in the second vertical region serving as a first bond pad for making a connection to another pad on a stacked die, and the TSVs being electrically connected to the first bond pad, wherein the top and bottom dies are bonded together in a face-to-face mariner by bonding a first bond pad of each die together to form the three-dimensional stacked IC;

a first metal connection layer electrically coupled to both the TSVs and the first bond pad of the top die;

a second metal connection layer electrically coupled to both the TSVs and the first bond pad of the bottom die, wherein the first and the second metal connection layers are continuously disposed from the second vertical region to the first vertical region;

a back-side metal layer in an electrical contact with the TSVs in the second vertical region, wherein external signals are provided to the bottom die through the back-side metal layer and the TSVs of the top die;

a second bond pad formed in direct contact with the back-side metal layer for attaching a bonding wire thereto, wherein the external signals are provided to the second bond pad via the bonding wire;

at least one inter-connector connecting the TSVs to the second bond pad providing external signals to the second bond pad; and wherein the second metal connection layer extends continuously from the second vertical region to the first vertical region to provide the external signals to each die, and wherein no TSV is formed in the first vertical region, thereby the I/O pad structure being used for packaging more than a single IC chip without redesigning a structure of the first vertical region.

8. The I/O pad structure of claim 7, wherein the first bond pad is made of Cu material.

9. The I/O pad structure of claim 7, wherein the semiconductor devices include transistors used in a circuit selected from the group consisting of input buffer, output driver and electrostatic discharge (ESD) circuit.

10. The I/O pad structure of claim 7, wherein the second bond pad is made of aluminum material.

11. An I/O pad structure in a three-dimensional stacked integrated circuit (IC) with a top die and a bottom die bonded together, the I/O pad structure of each die comprising:

a first vertical region including a first top metal layer and one or more semiconductor devices formed on a semiconductor substrate, the first top metal layer in the first vertical region serving as a first bond pad, the semiconductor devices being electrically connected to the first bond pad, wherein the top and bottom dies are bonded together in a face-to-face manner by bonding a first bond pad of each die together to form the three-dimensional stacked IC;

a second vertical region next to the first vertical region including a second top metal layer and one or more through-silicon-vias (TSVs) formed in said semiconductor substrate, the top die and the bottom die, the second top metal layer in the second vertical region serving as a probe pad for a probe to make a contact thereto during a test, and the TSVs being electrically connected to the probe pad;

a first metal connection layer electrically coupled to both the TSVs and the first bond pad of the top die;

a second metal connection layer electrically coupled to both the TSVs and the first bond pad of the bottom die, wherein the second metal connection layer is continuously disposed from the second vertical region to the first vertical region;

a back-side metal layer in an electrical contact with the TSVs in the second vertical region, wherein external signals are provided to the semiconductor devices of the first vertical region through the back-side metal layer and the TSVs of the top die;

a second bond pad formed in direct contact with the back-side metal layer for attaching a bonding wire thereto, wherein the external signals are provided to the second bond pad via the bonding wire;

at least one inter-connector connecting the TSVs to the second bond pad for providing external signals to the second bond pad; and wherein the first metal connection layer of the top die extends continuously from the second vertical region to the first vertical region to provide the external signals to each die, and wherein no TSV is formed in the first vertical region, thereby the I/O pad structure being used for packaging more than a single IC chip without redesigning a structure of the first vertical region.

12. The I/O pad structure of claim 11, wherein the first bond pad is made of Cu material.

13. The I/O pad structure of claim 11, wherein the semiconductor devices include transistors used in a circuit selected from the group consisting of input buffer, output driver and electrostatic discharge (ESD) circuit.

14. The I/O pad structure of claim 11, wherein the second bond pad is made of aluminum material.

* * * * *